US012696782B2

(12) United States Patent
Darmawikarta et al.

(10) Patent No.: US 12,696,782 B2
(45) Date of Patent: Jul. 28, 2026

(54) ELECTRICAL TRACES ON GLASS CORES IN INTEGRATED CIRCUIT PACKAGES AND METHODS OF MANUFACTURING THE SAME

(71) Applicant: Intel Corporation, Santa Clara, CA (US)

(72) Inventors: Kristof Darmawikarta, Chandler, AZ (US); Haobo Chen, Chandler, AZ (US); Xiaoying Guo, Chandler, AZ (US); Hongxia Feng, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 455 days.

(21) Appl. No.: 17/556,558

(22) Filed: Dec. 20, 2021

(65) Prior Publication Data

US 2023/0197540 A1     Jun. 22, 2023

(51) Int. Cl.
*H10W 70/692*     (2026.01)
*H10W 20/48*     (2026.01)
*H10W 70/685*     (2026.01)

(52) U.S. Cl.
CPC ......... *H10W 70/692* (2026.01); *H10W 20/48* (2026.01); *H10W 70/685* (2026.01)

(58) Field of Classification Search
CPC ............... H01L 23/15; H01L 23/49822; H01L 23/5329; H01L 21/4857; H01L 21/486; H01L 23/49816; H01L 23/49827; H01L 23/49894; H10W 70/692; H10W 20/48; H10W 70/685; H10W 70/635; H10W 70/69; H10W 70/05; H10W 70/095; H10W 90/701
See application file for complete search history.

(56) References Cited

U.S. PATENT DOCUMENTS

| | | | |
|---|---|---|---|
| 2019/0206823 A1* | 7/2019 | Darmawikarta | .... H01L 21/4853 |
| 2020/0027728 A1* | 1/2020 | Wang | ............... H01L 21/02422 |
| 2020/0161248 A1* | 5/2020 | Lee | ......................... H01L 23/50 |
| 2021/0287977 A1* | 9/2021 | Mok | ...................... H01L 23/13 |

* cited by examiner

*Primary Examiner* — Patricia D Valenzuela
(74) *Attorney, Agent, or Firm* — Hanley, Flight & Zimmerman, LLC

(57) ABSTRACT

Methods, apparatus, systems, and articles of manufacture are disclosed to enable electrical traces on glass cores in integrated circuit packages that includes an integrated circuit (IC) package substrate comprising a glass core, a photo-imageable dielectric (PID) material on the glass core, and metal interconnects in openings in the PID material.

20 Claims, 9 Drawing Sheets

ELECTRICAL TRACES ON GLASS CORES IN INTEGRATED CIRCUIT PACKAGES AND METHODS OF MANUFACTURING THE SAME

FIELD OF THE DISCLOSURE

This disclosure relates generally to integrated circuit packages and, more particularly, to electrical traces on glass cores in integrated circuit packages and methods of manufacturing the same.

BACKGROUND

Integrated circuit (IC) chips and/or semiconductor dies are routinely connected to larger circuit boards such as motherboards and other types of printed circuit boards (PCBs) via a package substrate. As integrated circuit (IC) chips and/or dies reduce in size and interconnect densities increase, alternatives to traditional substrate layers are needed for providing routing.

Figure 1:
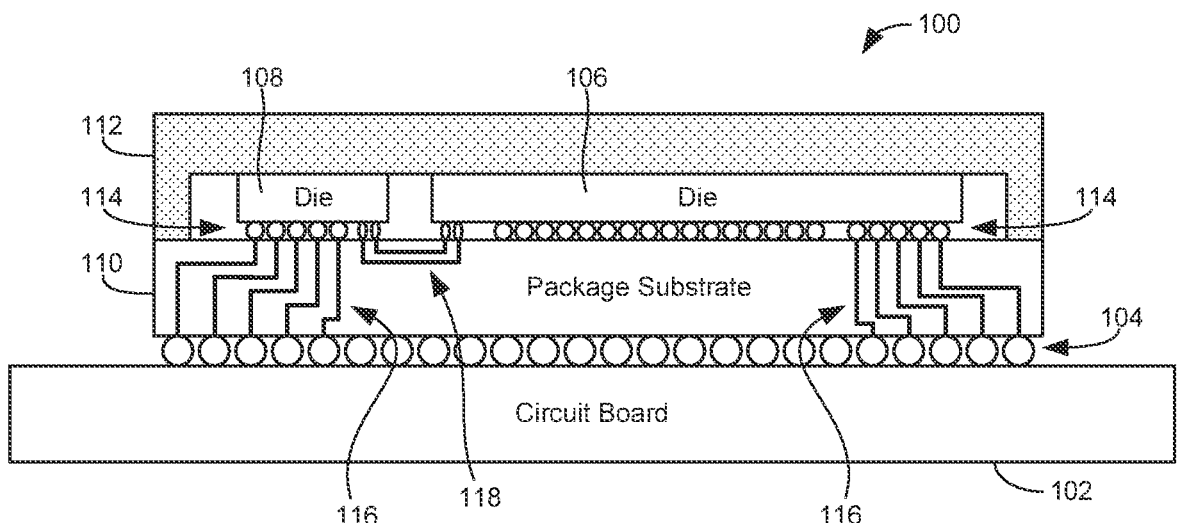
FIG. 1 illustrates an example integrated circuit (IC) package on a printed circuit board.

The figures are not necessarily to scale. Instead, the thickness of the layers or regions may be enlarged in the drawings. Although the figures show layers and regions with clean lines and boundaries, some or all of these lines and/or boundaries may be idealized. In reality, the boundaries and/or lines may be unobservable, blended, and/or irregular.

In general, the same reference numbers will be used throughout the drawing(s) and accompanying written description to refer to the same or like parts.

As used herein, unless otherwise stated, the term "above" describes the relationship of two parts relative to Earth. A first part is above a second part, if the second part has at least one part between Earth and the first part. Likewise, as used herein, a first part is "below" a second part when the first part is closer to the Earth than the second part. As noted above, a first part can be above or below a second part with one or more of: other parts therebetween, without other parts therebetween, with the first and second parts touching, or without the first and second parts being in direct contact with one another. Notwithstanding the foregoing, in the case of a semiconductor device, "above" is not with reference to Earth, but instead is with reference to a bulk region of a base semiconductor substrate (e.g., a semiconductor wafer) on which components of an integrated circuit are formed. Specifically, as used herein, a first component of an integrated circuit is "above" a second component when the first component is farther away from the bulk region of the semiconductor substrate than the second component.

As used in this patent, stating that any part (e.g., a layer, film, area, region, or plate) is in any way on (e.g., positioned on, located on, disposed on, or formed on, etc.) another part, indicates that the referenced part is either in contact with the other part, or that the referenced part is above the other part with one or more intermediate part(s) located therebetween. As used herein, connection references (e.g., attached, coupled, connected, and joined) may include intermediate members between the elements referenced by the connection reference and/or relative movement between those elements unless otherwise indicated. As such, connection references do not necessarily infer that two elements are directly connected and/or in fixed relation to each other. As used herein, stating that any part is in "contact" with another part is defined to mean that there is no intermediate part between the two parts.

Unless specifically stated otherwise, descriptors such as "first," "second," "third," etc., are used herein without imputing or otherwise indicating any meaning of priority, physical order, arrangement in a list, and/or ordering in any way, but are merely used as labels and/or arbitrary names to distinguish elements for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for identifying those elements distinctly that might, for example, otherwise share a same name. As used herein, "approximately" and "about" refer to dimensions that may not be exact due to manufacturing tolerances and/or other real world imperfections.

DETAILED DESCRIPTION

FIG. 1 illustrates an example integrated circuit (IC) package 100 that is electrically coupled to a circuit board 102. In some examples, the IC package 100 is electrically coupled to the circuit board 102 by first electrical connections 104. The first electrical connections 104 may include pins, pads, bumps, and/or balls to enable the electrical coupling of the IC package 100 to the circuit board 102. In this example, the IC package 100 includes two semiconductor (e.g., silicon) dies 106, 108 that are mounted to a package substrate 110 and enclosed by a package lid or mold compound 112. While the example IC package 100 of FIG. 1 includes two dies 106, 108, in other examples, the IC package 100 may have only one die or more than two dies.

As shown in the illustrated example, each of the dies 106, 108 is electrically and mechanically coupled to the package substrate 110 via second electrical connections 114. The second electrical connections 114 may include pins, pads, balls, and/or bumps. The second electrical connections 114 between the dies 106, 108 and the package substrate 110 are sometimes referred to as first level interconnects. By contrast, the first electrical connections 104 between the IC package 100 and the circuit board 102 are sometimes referred to as second level interconnects. In some examples, one or both of the dies 106, 108 may be stacked on top of one or more other dies and/or an interposer. In such examples, the dies 106, 108 are coupled to the underlying die and/or interposer through a first set of first level interconnects and the underlying die and/or interposer may be connected to the package substrate 110 via a separate set of first level interconnects associated with the underlying die and/or interposer.

As shown in the illustrated example, the package substrate 110 includes first electrical traces and/or routing 116 that electrically connects the first electrical connections 104 with the second electrical connections 114, thereby enabling the electrical coupling of the first and/or second dies 106, 108 with the circuit board 102. Further, in some examples, the package substrate 110 includes second electrical traces and/or routing 118 that electrically connect different ones of the first electrical connections 104 associated with the first and second dies 106, 108, thereby enabling the electrical coupling of the first and second dies 106, 108. Further detail regarding example implementations of the electrical routing 116, 118 is provided below in connection with FIG. 2.

Figure 2:
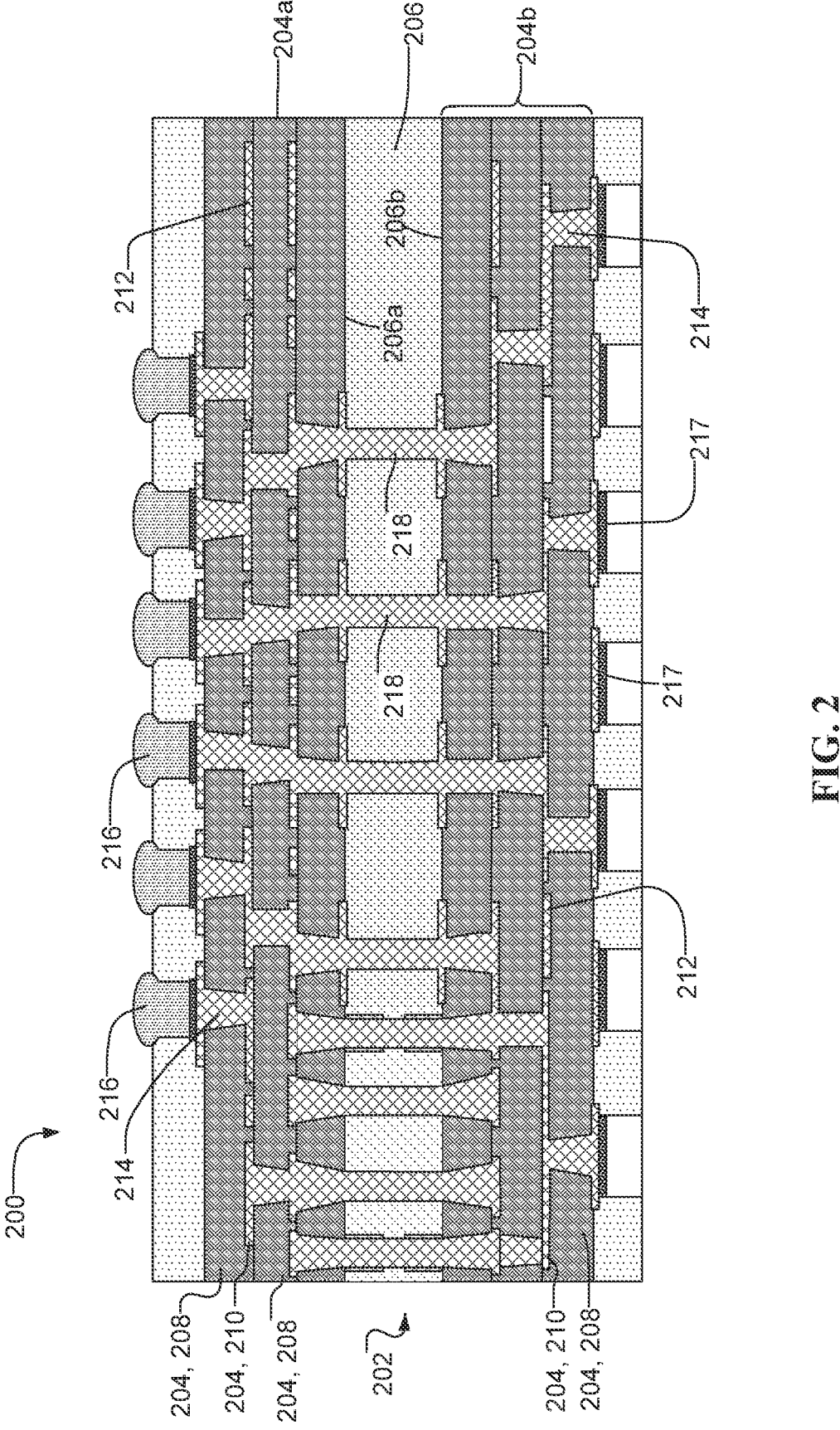
FIG. 2 illustrates a cross-sectional view of an example package substrate that may be implemented in the IC package of FIG. 1.

FIG. 2 is a cross-sectional view of an example package substrate 200 that may be implemented in the IC package 100 of FIG. 1 (e.g., as the package substrate 110 of FIG. 1). The package substrate 200 of the illustrated example includes a plurality of build-up layers 204 and a glass substrate or core 206. Specifically, the build-up layers 204 are provided on a first surface 206a of the glass core 206 and a second surface 206b of the glass core 206 opposite the first surface 206a. The build-up layers 204 of the illustrated example are provided in an alternating pattern of insulation of dielectric layers 208 and patterned conductive layers 210 providing a plurality of traces 212 between the dielectric layers 208. The traces 212 of the illustrated example define signal traces or electrical routing (e.g., signaling or transmission lines) to transfer signals or information between various components (e.g., transistors, capacitors, resistors, backend layers, etc. and/or other circuitry) of an associated IC package (e.g., the IC package 100 of FIG. 1). Electrically conductive vias 214 (e.g., copper plated vias) extend through the dielectric layers 208 and electrically interconnect the conductive layers 210 (e.g., the traces 212) of the different build-up layers 204. In the illustrated example, the package substrate 110 includes a plurality of solder connectors 216 (e.g., solder balls) and a plurality of solder pads 217 to electrically couple the package substrate 110 to a printed circuit board, an interposer and/or any other substrate(s).

The glass core 206 of the illustrated example is positioned between a first plurality 204a of the first build-up layers 204 (e.g., on the first surface 206a of the core layer 206) and a second plurality 204b of the build-up layers 204 (e.g., on the second surface 206b of the core layer 206). To communicatively and/or electrically couple one or more of the first plurality 204a of the build-up layers 204 and one or more of the second plurality 204b of build-up layers 204, the glass core 206 of the illustrated example employs a plurality of through glass vias (TGVs) 218 (e.g., copper plated vias).

Although the glass core 206 of the example package substrate 200 is shown as a central core of the substrate 200, in some examples, the glass core 206 can be an interposer and/or any other layer of the package substrate 200. For example, the glass core 206 can be used in place of one or more of the dielectric layers 208 of the package substrate 200. In some examples, the glass core 206 can be composed of different material(s) including organic materials, silicon, and other conventional materials for fabricating package substrates. In some examples, the example package substrate 200 includes an embedded multi-die interconnect bridge (EMIB).

Although not shown, other build-up layers 204 can be provided on the glass substrate 202 using conventional semiconductor manufacturing techniques or processes including, but not limited to, photolithography, integrated circuit microfabrication techniques, wet etching, dry etching, anisotropic etching, spin coating, electroforming or electroplating, laser ablation, sputtering, chemical deposition, plasma deposition, surface modification, injection molding, hot embossing, thermoplastic fusion bonding, low temperature bonding using adhesives, stamping, machining, 3-D printing, laminating, and/or any other processes commonly used for manufacture of semiconductor devices.

Industry-standard high density substrate packaging techniques use organic cores (e.g., epoxy-based prepreg layer with glass cloth) as a starting material in next-generation compute applications. These next-generation compute applications have an increased demand in scaling, which along with the proliferation of multichip architectures, specifies (e.g., dictates, requires, etc.) a reduction in warpage and thickness variation. As a result, the starting organic core material has become thicker in every generation to provide an effective lower coefficient of thermal expansion (CTE). The thicker starting organic core material bridges the gap (e.g., the difference, the delta) to the CTE of the silicon dies (e.g., the dies 106, 108 of FIG. 1) mounted on such substrates. However, increasing core thickness is not a universal solution, because some applications have a total core thickness restricted by customer demands (e.g., portable machines, mobile devices, etc.). In addition, the increased core thickness may be detrimental to the electrical performance of the product.

Using glass as a starting core material (e.g., the glass core 206 of FIG. 2) has a mechanical benefit, an electrical benefit, and a design flexibility benefit over using traditional organic core materials (e.g., epoxy-based prepreg). However, traditional approaches to directly route signal transmission lines (e.g., the traces 212) on the glass core are insufficient due to a large delta between the CTE of the glass and the CTE of the copper which can induce delamination during subsequent fabrication processes.

Traditional approaches use a buffer or transition layer (e.g., nonpatternable ABF) between the glass core and the copper traces or interconnects. However, using a transition layer includes additional (e.g., extra) processing steps which increase the cost of manufacturing. Some additional processing steps include the creation of copper vias that extend through the transition layer to electrically couple TGVs (e.g., the TGVs 218) in the glass core to the electrical traces deposited above the transition layer. In such situations, the via diameter needs to be defined to accommodate any overlay margin (e.g., the alignment) with the underlying TGV, which may necessitate the use of ultra-violet (UV)

laser or excimer laser technology. Such processing techniques can significantly add to the costs of manufacturing package substrates with glass cores. The fact that there is no electrical routing directly on the glass core leads to extra processing to translate the "core" routing away from the glass surface.

Figure 3:
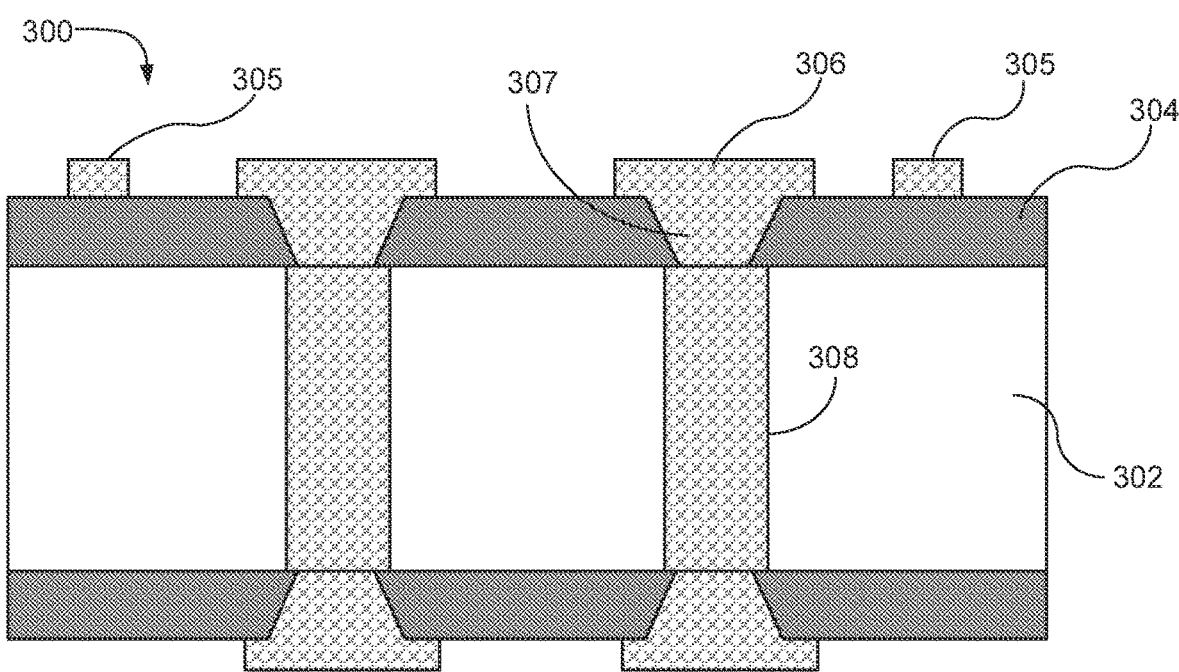
FIG. 3 illustrates a cross-sectional view of known package substrate that does not provide routing on an associated glass core.

FIG. 3 illustrates a traditional package substrate 300 that includes a glass core 302 and an organic buffer layer 304 that separates a surface of the glass core from copper traces 305 on the buffer layer 304. Further, the package substrate also includes metal pads 306 (in the same metallization layer as the traces 305) that are electrically coupled to associated metal vias 307 extending through the buffer layer 304. The metal vias 307 are aligned with TGVs 308 that extend through the glass core 302. The traces 305, the metal pads 306, the metal vias 307, and the TGVs 308 may all be made of copper (Cu). However, the copper associated with these different components may be deposited in multiple different processes. For instance, the copper for the TGVs 308 may be deposited first followed by the addition of the buffer layer 304. Openings for the metal vias 307 may then be etched in the buffer layer 304 at which point copper for the metal vias 307 is deposited in the openings. Finally, the copper for the traces 305 and the metal pads 306 may be added thereafter.

The glass core 302 is in contact with the organic buffer layer 304. In some examples, the organic buffer layer 304 is non-patternable material (e.g., ABF). As used herein, a non-patternable material (also referred to herein as a non-photo-imageable material) is a material that is not capable of being patterned using traditional photolithography techniques. The buffer layer 304 of FIG. 3 is used as a transition layer between the glass core 302 and the metal traces 305. The metal vias 307 enable the electrically coupling of the TGVs 308 to the metal pads 306 and, in turn, to the traces 305. To accommodate overlay margins between the metal vias 307 and the TGVs 308, the diameter of the metal vias 307 are controlled by etching openings in the buffer layer 304 for the vias 307 using UV laser or excimer laser technology which increases the cost of manufacturing the package substrate 300.

The organic buffer layer 304 is used as a CTE transition layer. That is, the CTE of the organic buffer layer 304 has an intermediate CTE compared to the CTE of the glass core 302 at one extreme, and the CTE of the metal (copper) interconnects (e.g., the traces 305, the metal pads 306, the metal vias 307, and the TGVs 308) at the other extreme. For example, as the materials are heated, due to the different CTEs, the materials will expand at different rates. This difference in expansion can result in the delamination of copper that is attached directly to the glass core 302. However, by positioning the organic buffer layer 304 between the glass core 302 and the metal (copper) interconnects (e.g., the traces 305, the metal pads 306, the metal vias 307, and the TGVs 308), the likelihood of delamination is significantly reduced. The organic buffer layer 304 is able to prevent delamination, but is non-patternable and increases the cost of manufacturing the package substrate 300.

Figure 4A:
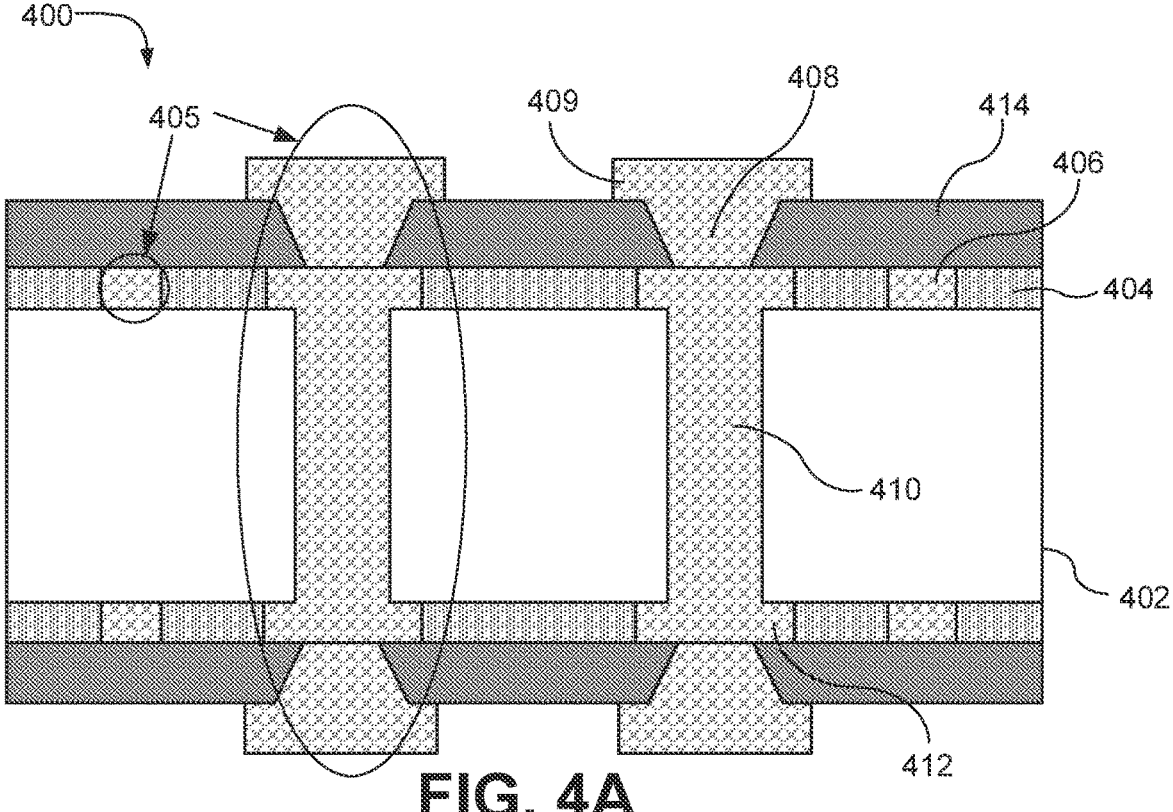
FIG. 4A illustrates a cross-sectional view of an example package substrate constructed in accordance with teachings disclosed herein to provide routing on an associated example glass core.

FIG. 4A illustrates an example package substrate 400 that may be implemented in the example IC package 100 of FIG. 1 (e.g., as the package substrate 110 of FIG. 1). As shown in the illustrated example, the package substrate 400 includes a glass core 402, a photo-imageable dielectric (PID) material 404 (e.g., a PID layer, a PID material layer) on the glass core 402, and metal overplating deposited within openings in the glass core 402 and the PID material 404. In some examples, the metal overplating may be used to manufacture separate components, namely metal routing or traces 406, TGVs 410, and contact pads 412 at ends of the TGVs 410. Further, as shown in FIG. 4A, the example package includes a standard build-up layer dielectric material 414 on the PID material 404 with metal vias 408 provided therein and associated metal pads 409 positioned thereon. As used herein, the traces 406, the metal vias 408, the metal pads 409, the TGVs 410, and the contact pads 412 are collectively referred to as metal interconnects 405. In some examples, the metal interconnects 405 are composed of any suitable conductive material (e.g., copper). In some examples, the metal interconnects 405 are added after the PID material 404 (e.g., buffer layer, PID layer) has already been deposited on the glass core 402 which mitigates the stresses based on the delta in the CTE of the glass core 402 and the CTE of the metal interconnects 405. In some examples, the metal routing or traces 406, the TGVs 410, and the contact pads 412 are added in a single damascene process. Thus, as shown in the illustrated examples, the contact pads 412 (which extend beyond the outer surfaces of the glass core 402) are continuous extensions of the TGVs 410 (which extend between the outer surfaces of the glass core 402). Furthermore, as shown in FIG. 4A, the contact pads 412 extend outward in a direction transverse to the longitudinal axis of the TGVs 410. That is, the width (e.g., diameter) of the contact pads 412 is larger than the width (e.g., diameter) of the TGVs 410. As a result, the contact pads 412 define a larger area that the cross-sectional area of the TGVs 410, thereby reducing concerns of misalignment between the contact pads 412 and the metal vias 408. With a larger overlay margin, the openings for the metal vias 408 can be created using simpler and less expensive processes than is possible for the metal vias 307 of FIG. 3. The package substrate 400 has no transition layer between the glass core 402 and the metal traces 406.

In some examples, the PID material 404 is a photo-imageable dielectric. As used herein, a photo-imageable material (also referred to herein as a patternable material) is a material that is capable of being patterned using traditional photolithography techniques. Thus, the PID material 404 has different properties than the traditional material (e.g., ABF) used in the buffer layer 304 discussed above in connection with FIG. 3. Likewise, the PID material 404 has different properties than the standard build-up layer dielectric material 414 deposited on the PID material 404. More particularly, in some examples, the standard build-up layer dielectric material 414 is composed of the same material traditionally used in build-up layers (e.g., ABF). Some examples of the PID material 404 include polyimide (PI), polybenz-oxazoles (PBO), Benzocyclobutene (BCB), epoxy or an acrylic. The PID material 404 acts as an intermediate between the glass core 402 and the metal interconnects 405 when the metal interconnects 405 are embedded in the PID material 404. The PID material 404 is a buffer layer, which decreases the delamination and the stress because the PID material 404 is already present on the glass core 402, before the metal interconnects 405 are added by overplating. In some examples, the ability of the PID material 404 to be patterned by photolithography enables openings in the PID material 404 to be created that are used to define the traces 406 and the contacts pads 412 as discussed further below in connection with FIGS. 5-10.

Figure 4B:
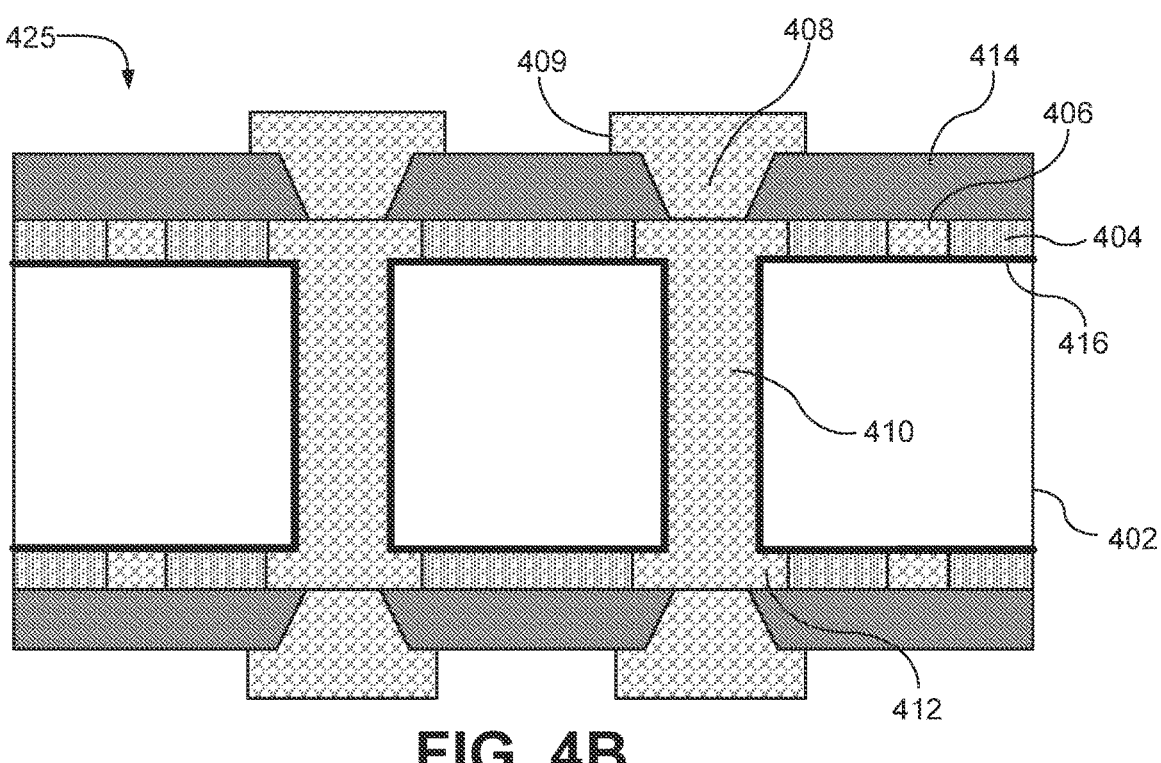
FIG. 4B illustrates a cross-sectional view of another example package substrate with an adhesion layer on an associated example glass core.

FIG. 4B illustrates another example package substrate 425 that may be implemented in the example IC package 100 of FIG. 1 (e.g., as the package substrate 110 of FIG. 1). Many of the structures and features of the package substrate 425 of FIG. 4B are similar or identical to those described above in connection with the package substrate 400 of FIG. 4A. Accordingly, the same reference numerals will be used to identify the same or similar structures and/or features. The example package substrate 425 of FIG. 4B differs from the package substrate 400 of FIG. 4A in that the package substrate 425 includes an adhesion layer 416 that is directly adjacent (e.g., in contact with) the exposed surfaces of the glass core 402. That is, when the adhesion layer 416 is deposited, the adhesion layer 416 conformally coats all exposed surfaces of the glass core 402. The example adhesion layer 416 is deposited on the glass core 402 before the PID material 404 is deposited to facilitate the attachment or adhesion of the PID material 404 and/or the metal for the metal traces 406, the TGVs 410, and the contact pads 412 to the glass core 402. Thus, in some examples, the metal traces 406 may not be in direct contact with the glass core 402. However, the metal traces 406 will still be considerably closer to the glass core 402 than they would be if the traces 406 were added to the outer surface of a buffer layer (e.g., such as the buffer layer 304 of FIG. 3). More particularly, the thickness for the buffer layer 304 is typically at least 10-20 μm, whereas thickness of the adhesion layer 416 is typically less than 100-500 nm. The PID material 404 is deposited on the adhesion layer 416. In some examples, the adhesion layer 416 includes at least one of silicon or nitrogen (e.g., Silicon Nitride, SiNx, $Si_3N_4$, Silicon Oxide, SiOx).

In some examples, the adhesion layer 416 is a dielectric material. However, in some examples, the adhesion layer 416 is a different material than the build-up layer dielectric material 414. Thus, as used herein, the term build-up layer dielectric material excludes the material used for the adhesion layer 416. Accordingly, in such examples, the metal traces 406 extend along a surface of the glass core 402 without a build-up layer dielectric material between the metal traces 406 and the glass core.

Figure 4C:
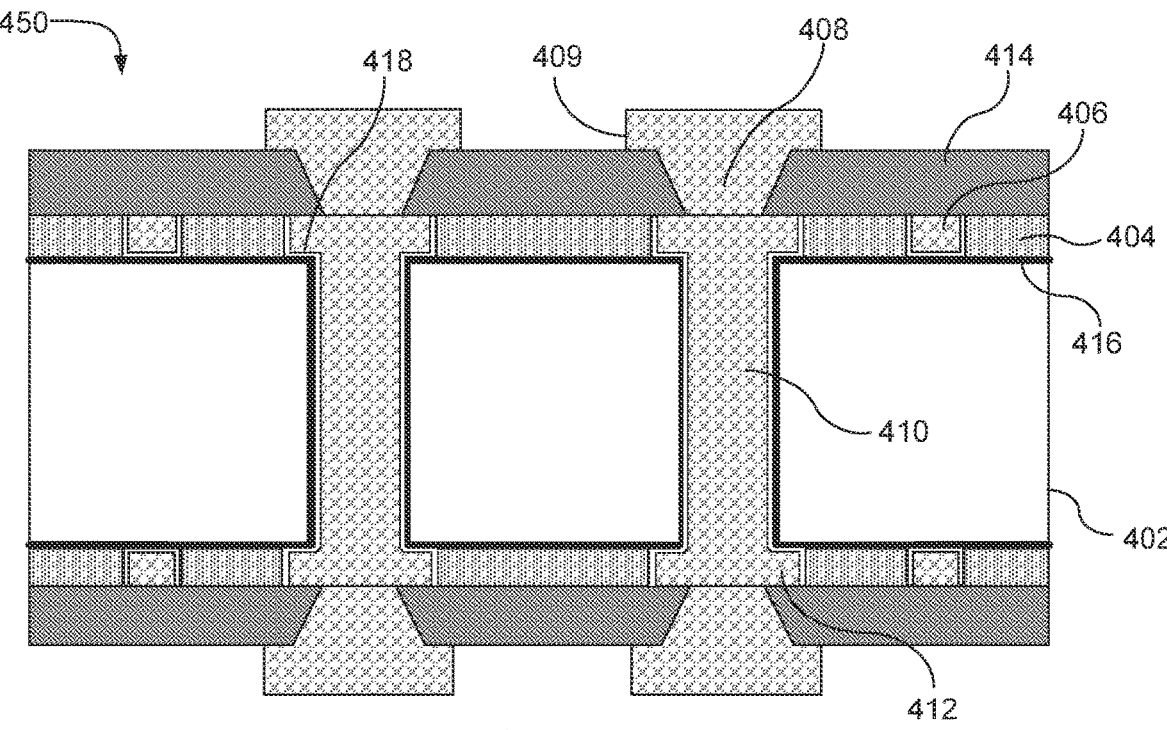
FIG. 4C illustrates a cross-sectional view of another example package substrate with a metal seed layer on an associated example glass core.

FIG. 4C illustrates another example package substrate 450 that may be implemented in the example IC package 100 of FIG. 1 (e.g., as the package substrate 110 of FIG. 1). Many of the structures and features of the package substrate 450 of FIG. 4C are similar or identical to those described above in connection with the package substrates 400, 425 of FIGS. 4A and 4B. Accordingly, the same reference numerals will be used to identify the same or similar structures and/or features. The example package substrate 450 of FIG. 4B differs from the package substrate 400 of FIG. 4A in that package substrate 450 includes the adhesion layer 416 and a seed layer 418. The seed layer 418 is deposited (e.g., by a sputtering process) after the PID material 404 is deposited patterned and before the metal is deposited. Thus, when the seed layer 418 is deposited, the seed layer 418 conformally coats all exposed surfaces of the PID material 404 (including within the patterned openings within the PID material 404) and the adhesion layer 416 (which itself conformally coats the glass core 402). However, as shown in the illustrated example, portions of the seed layer 418 are removed by etching, polishing, or planarization on the outward facing surfaces of the PID material 404. The seed layer 418 coats the surfaces where the metal interconnects 405 are to be located to facilitate the subsequent deposition of the metal for the metal interconnects 405 in a damascene process. In some examples, the seed layer 418 includes titanium and copper (e.g., Ti/Cu, TiN/Cu, TiNx). In some examples, the seed layer 418 includes tantalum and copper (e.g., Ta, Ta/Cu, TaN/Cu, TaNx). In some examples, the titanium or tantalum portion of the seed layer 418 has a thickness of approximately 10-50 nm and the copper portion of the seed layer 418 has a thickness of approximately 100-500 nm. While both the adhesion layer 416 and the seed layer 418 are shown in FIG. 4B, in some examples, the adhesion layer 416 is omitted such that the seed layer 418 is in direct contact with the glass core 402.

The foregoing examples of the package substrates 400, 425, 450 of FIGS. 4A-4C teach or suggest different features. Although each example package substrates 400, 425, 450 disclosed above has certain features, it should be understood that it is not necessary for a particular feature of one example to be used exclusively with that example. Instead, any of the features described above and/or depicted in the drawings can be combined with any of the examples, in addition to or in substitution for any of the other features of those examples. One example's features are not mutually exclusive to another example's features. Instead, the scope of this disclosure encompasses any combination of any of the features.

Figure 5:
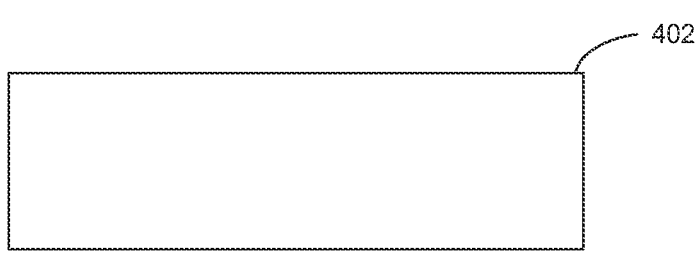
FIGS. 5-10 illustrate various stages in an example process of manufacturing the example package substrates of any one of FIGS. 4A-4C.

FIGS. 5-10 illustrate various stages in an example process of fabrication of the example package substrate 400 of FIG. 4A. Similar process operations can also be used to manufacture the package substrates 425, 450 of FIGS. 4B and/or 4C. FIG. 5 represents the glass core 402 in an initial state ready to be fabricated into a semiconductor package substrate.

Figure 6:
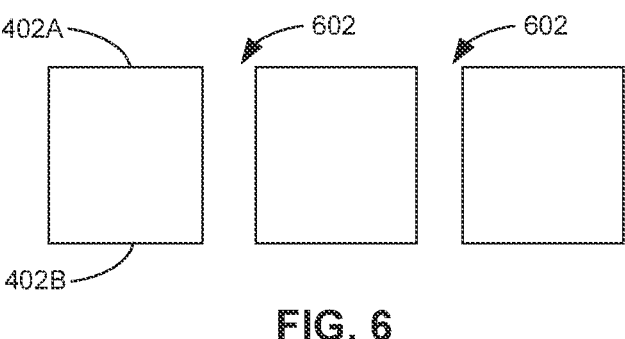

FIG. 6 illustrates the glass core 402 being etched to include openings or through-holes 602 that are to define the locations for the TGVs 410 to be added during the metal overplating process described below in connection with FIG. 8. In this example, the through-holes 602 extend all the way through the glass core 402 from a first (e.g., top) surface 402A to a second (e.g., bottom) surface 402B of the glass core 402. In some examples, after reaching the stage of fabrication represented in FIG. 6 (and before moving on to the stage represented in FIG. 7), an adhesion layer (e.g., the adhesion layer 416 of FIG. 4B) may be deposited on the exposed surfaces of the glass core 402, which includes both the top and bottom surfaces 402A, 402B as well as the walls of the openings 602. However, in some examples, the deposition of the adhesion layer 416 is omitted.

Figure 7:
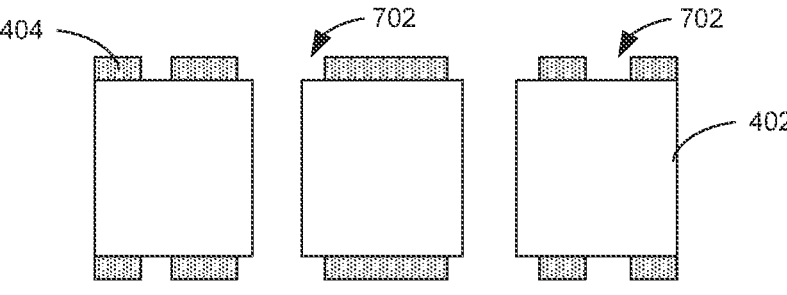

FIG. 7 illustrates the PID material 404 being deposited on the glass core 402. As described above, the PID material 404 is a patternable or photo-imageable material (by lithography). At the stage of fabrication represented by FIG. 7, the PID material 404 has already been patterned to include openings 702 that are to define the locations for the traces 406 and the contact pads 412 to be added during the metal overplating process described below in connection with FIG. 8. In the illustrated example of FIG. 7, the package substrate 400 of FIG. 4A is fabricated up to the point where the package substrate 400 of FIG. 4A is ready to receive the metal overplating. In some examples, after reaching the stage of fabrication represented in FIG. 7 (and before moving on to the overplating process represented in FIG. 8), a metal seed layer (e.g., the seed layer 418 of FIG. 4C) may be deposited on the exposed surfaces of the assembly. In such examples, the seed layer 418 conformally coats the exposed inner surfaces of the openings 702 in the PID as well as the exposed inner surfaces of the openings 602 extending through the glass core 402. In some examples, the seed layer 418 is in direct contact with the exposed surfaces of the glass core 402. In other examples, when the adhesion layer 416 is included, the adhesion layer 416 may be positioned between the seed layer 418 and the glass core 402. In some examples, the deposition of the seed layer 418 is omitted.

Figure 8:
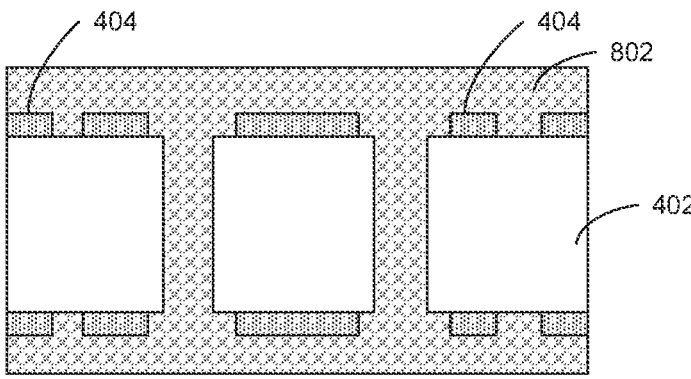

FIG. 8 illustrates the stage of fabrication following a metal overplating process. In this example, metal 802 is deposited in a single damascene process around the combined assembly of the glass core 402 and the PID material 404 (as well as the adhesion layer 416 and/or the seed layer 418 if included). Thus, as shown in the illustrated examples, the metal 802 completely fills the openings 602, 702 in the glass core 402 and the PID material 404 shown and described above in connection with FIGS. 6 and 7. Further, in this example, the overplating process involves depositing excess metal 802 that extends beyond the PID material 404 to ensure that the openings 702 defined in the PID material 404 are completely filled. In some examples, the metal 802 is copper.

Figure 9:
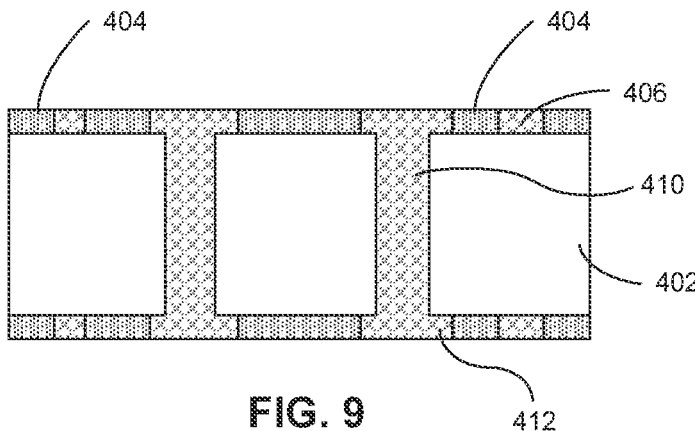

FIG. 9 illustrates the result of a chemical-mechanical planarization (CMP) process which removes the excess metal 802, thereby again exposing the outer surface of the PID material 404. By removing the excess metal 802 down to the PID material 404, the metal 802 in the different openings 702 within the PID material 404 becomes electrically isolated to serve as the traces 406 that extend along the surface of the glass core 402 and/or the contact pads 412 located at the ends of the TGVs 410. In the illustrated example of FIG. 9, the example package substrate 400 of FIG. 4A is ready to receive the build-up layer, which may be manufactured in accordance with any suitable fabrication processes.

Figure 10:
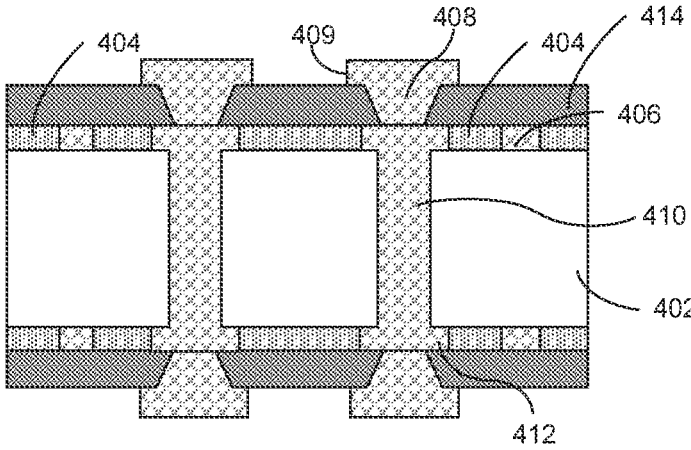

FIG. 10 illustrates the completed package substrate 400 of FIG. 4A after the addition of the standard build-up layer dielectric material 414 and the subsequent addition of the metal vias 408 and the associated metal pads 409. In some examples, additional metal traces may be added on to the build-up layer dielectric material 414 in the same metallization layer as the metal pads 409. Further, in some examples, subsequent processing may involve the inclusion of additional build up layers to provide complete interconnects that are electrically coupled between opposite sides of a complete package substrate (such as those shown in FIGS. 1 and 2).

Figure 11:
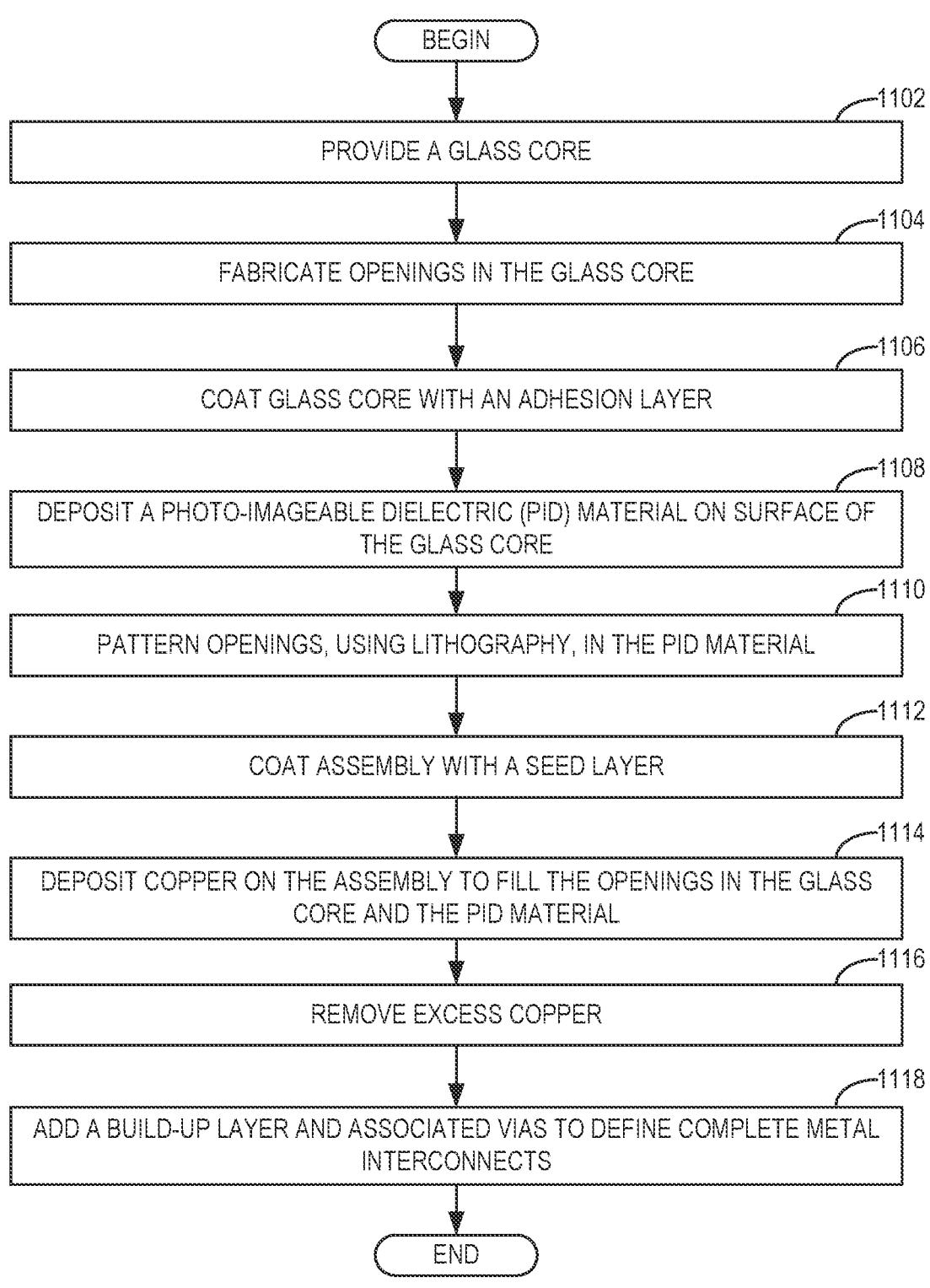
FIG. 11 is a flowchart representative of an example method of manufacturing the example package substrate of any one of FIGS. 4A-4C in accordance with example techniques described in connection with FIGS. 5-10.

FIG. 11 is a flowchart illustrating an example method of manufacturing a substrate (e.g., the package substrate 110 of FIG. 1, the package substrate 400 of FIG. 4A) with a glass core as described above in connection with FIGS. 5-10. Although the example method of manufacture is described with reference to the flowchart illustrated in FIG. 11, many other methods may alternatively be used. For example, the order of execution of the blocks may be changed, and/or some of the blocks described may be combined, divided, re-arranged, omitted, eliminated, and/or implemented in any other way.

The example process begins at block 1102 by providing a glass core 402. At block 1104, the method includes fabricating openings (e.g., the openings 602 of FIG. 6) in the glass core 402. The openings are to define the location of through-glass-vias (TGVs) extending through the glass core once filled with metal as discussed further below. The method includes optional block 1106 which involves coating the glass core 402 with an adhesion layer 416. In some examples, the adhesion layer includes at least one of silicon or nitride (e.g., SiNx).

At block 1108, the method includes depositing a photo-imageable dielectric (PID) material 404 on the surface of the glass core 402. In some examples, (e.g., examples with the optional adhesion layer 416), the PID material 404 is deposited on the optional adhesion layer 416. At block 1110, the method includes patterning the PID material 404, using lithography, to define openings (e.g., the openings 702 of FIG. 7) in the PID material 404. In some examples, the openings are to define the location of traces and contact pads for the TGVs once filled with metal as discussed further below.

The method advances to optional block 1112. At block 1112, the method includes coating the assembly with a seed layer 418. The seed layer 418 may include titanium and copper. The seed layer 418 may be deposited via a sputtering process. If the optional block 1112 is implemented, in some examples, an etching or planarization process may also be implemented to remove portions of the seed layer 418 on the outward facing surfaces of the PID material 404 so that the openings 602, 702 remain electrically isolated from one another. At block 1114, the method includes depositing copper on the assembly to fill the openings 602, 702 in the glass core 402 and the PID material 404. In the illustrated example, the deposited copper serves as the metal interconnects 405 of FIG. 4A. In some examples, the disposition of the copper includes depositing excess copper to ensure that all the openings are completely filled. Accordingly, at block 1116, the method includes removing the excess copper. In some examples, the excess copper is removed through a chemical-mechanical planarization process. Finally, at block 1118, the method including adding a build-up layer dielectric material 414 and metal vias 408 to define complete metal interconnects 405. In some examples, a semi-additive process is used to apply the build-up layer dielectric material 414. In some examples, multiple build-up layers may be added. Thereafter, the method ends.

The example glass core substrates disclosed herein may be included in any suitable electronic component. FIGS. 12-15 illustrate various examples of apparatus that may include any of the glass core substrates disclosed herein.

Figure 12:
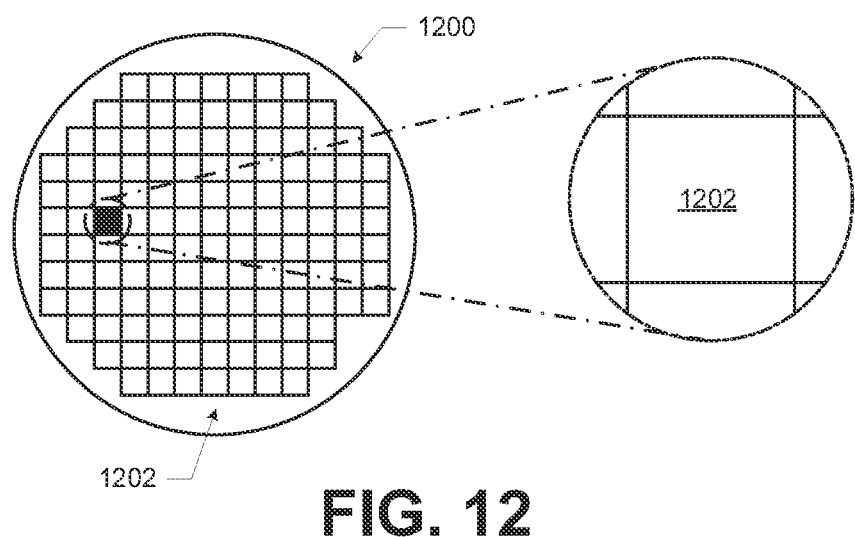
FIG. 12 is a top view of a wafer and dies that may be included in an IC package constructed in accordance with teachings disclosed herein.

FIG. 12 is a top view of a wafer 1200 and dies 1202 that may be included in the IC package 100 of FIG. 1 (e.g., as any suitable ones of the dies 106, 108). The wafer 1200 may be composed of semiconductor material and may include one or more dies 1202 having IC structures formed on a surface of the wafer 1200. Each of the dies 1202 may be a repeating unit of a semiconductor product that includes any suitable IC. After the fabrication of the semiconductor product is complete, the wafer 1200 may undergo a singulation process in which the dies 1202 are separated from one another to provide discrete "chips" of the semiconductor product. The die 1202 may include one or more transistors (e.g., some of the transistors 1340 of FIG. 13, discussed below), supporting circuitry to route electrical signals to the transistors, passive components (e.g., signal traces, resistors, capacitors, or inductors), and/or as well as any other IC components. In some examples, the wafer 1200 or the die 1202 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1202. For example, a memory array formed by multiple memory devices may be formed on a same die 1202 as a processing device (e.g., the processing device 1502 of FIG. 15) or other logic that is configured to store information in the memory devices or execute instructions stored in the memory array. The example IC package 100 disclosed herein may be manufactured using a die-to-wafer assembly technique in which some dies 106, 108 are attached to a wafer 1200 that include others of the dies 106, 108, and the wafer 1200 is subsequently singulated.

Figure 13:
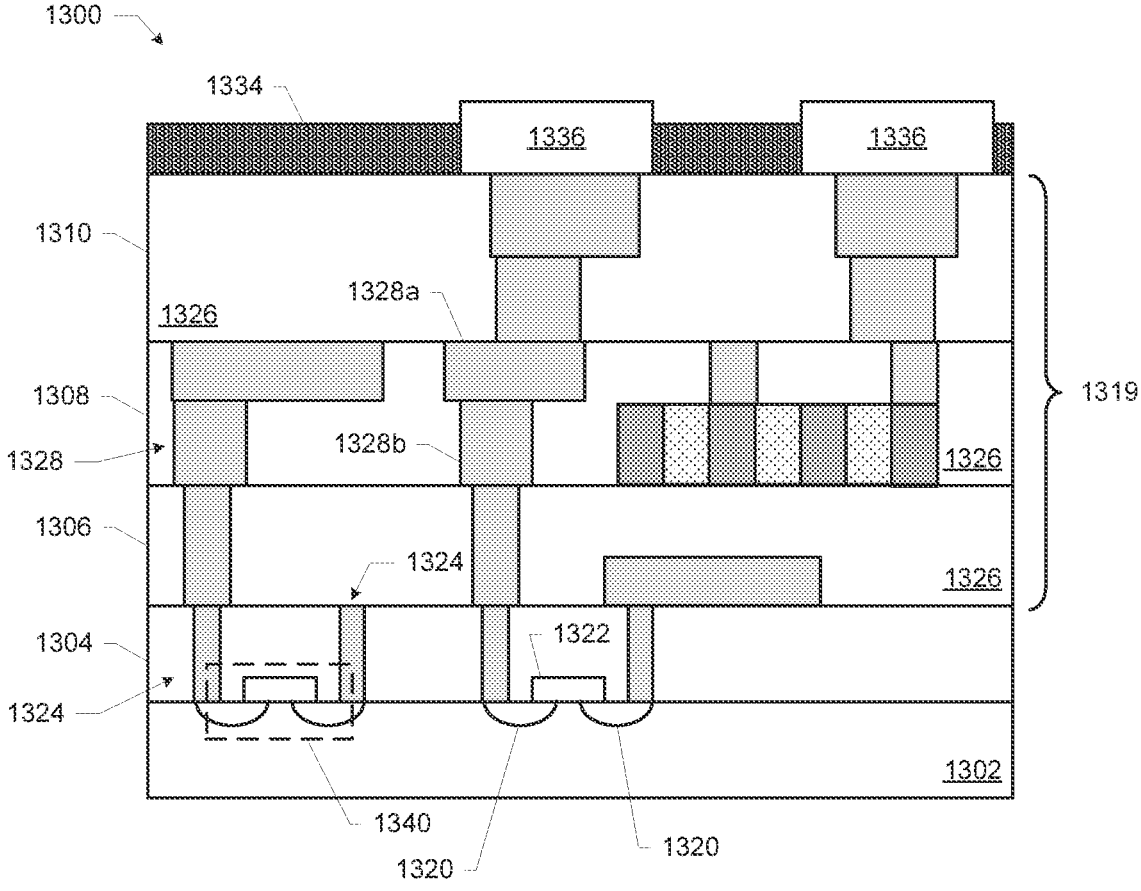
FIG. 13 is a cross-sectional side view of an IC device that may be included in an IC package constructed in accordance with teachings disclosed herein.

FIG. 13 is a cross-sectional side view of an IC device 1300 that may be included in the example IC package 100 (e.g., in any one of the dies 106, 108). One or more of the IC devices 1300 may be included in one or more dies 1202

(FIG. 12). The IC device 1300 may be formed on a substrate 1302 (e.g., the wafer 1200 of FIG. 12) and may be included in a die (e.g., the die 1202 of FIG. 12). The substrate 1302 may be a semiconductor substrate composed of semiconductor material systems including, for example, n-type or p-type materials systems (or a combination of both). The substrate 1302 may include, for example, a crystalline substrate formed using a bulk silicon or a silicon-on-insulator (SOI) substructure. In some examples, the substrate 1302 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 1302. Although a few examples of materials from which the substrate 1302 may be formed are described here, any material that may serve as a foundation for an IC device 1300 may be used. The substrate 1302 may be part of a singulated die (e.g., the dies 1202 of FIG. 12) or a wafer (e.g., the wafer 1200 of FIG. 12).

The IC device 1300 may include one or more device layers 1304 disposed on the substrate 1302. The device layer 1304 may include features of one or more transistors 1340 (e.g., metal oxide semiconductor field-effect transistors (MOSFETs)) formed on the substrate 1302. The device layer 1304 may include, for example, one or more source and/or drain (S/D) regions 1320, a gate 1322 to control current flow in the transistors 1340 between the S/D regions 1320, and one or more S/D contacts 1324 to route electrical signals to/from the S/D regions 1320. The transistors 1340 may include additional features not depicted for the sake of clarity, such as device isolation regions, gate contacts, and the like. The transistors 1340 are not limited to the type and configuration depicted in FIG. 13 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon and nanowire transistors.

Each transistor 1340 may include a gate 1322 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some examples, an annealing process may be carried out on the gate dielectric to improve its quality when a high-k material is used.

The gate electrode may be formed on the gate dielectric and may include at least one p-type work function metal or n-type work function metal, depending on whether the transistor 1340 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, and conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide), and any of the metals discussed above with reference to a PMOS transistor (e.g., for work function tuning).

In some examples, when viewed as a cross-section of the transistor 1340 along the source-channel-drain direction, the gate electrode may consist of a U-shaped structure that includes a bottom portion substantially parallel to the surface of the substrate and two sidewall portions that are substantially perpendicular to the top surface of the substrate. In other examples, at least one of the metal layers that form the gate electrode may simply be a planar layer that is substantially parallel to the top surface of the substrate and does not include sidewall portions substantially perpendicular to the top surface of the substrate. In other examples, the gate electrode may consist of a combination of U-shaped structures and planar, non-U-shaped structures. For example, the gate electrode may consist of one or more U-shaped metal layers formed atop one or more planar, non-U-shaped layers.

In some examples, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some examples, a plurality of spacer pairs may be used; for instance, two pairs, three pairs, or four pairs of sidewall spacers may be formed on opposing sides of the gate stack.

The S/D regions 1320 may be formed within the substrate 1302 adjacent to the gate 1322 of each transistor 1340. The S/D regions 1320 may be formed using an implantation/diffusion process or an etching/deposition process, for example. In the former process, dopants such as boron, aluminum, antimony, phosphorous, or arsenic may be ion-implanted into the substrate 1302 to form the S/D regions 1320. An annealing process that activates the dopants and causes them to diffuse farther into the substrate 1302 may follow the ion-implantation process. In the latter process, the substrate 1302 may first be etched to form recesses at the locations of the S/D regions 1320. An epitaxial deposition process may then be carried out to fill the recesses with material that is used to fabricate the S/D regions 1320. In some implementations, the S/D regions 1320 may be fabricated using a silicon alloy such as silicon germanium or silicon carbide. In some examples, the epitaxially deposited silicon alloy may be doped in situ with dopants such as boron, arsenic, or phosphorous. In some examples, the S/D regions 1320 may be formed using one or more alternate semiconductor materials such as germanium or a group III-V material or alloy. In further examples, one or more layers of metal and/or metal alloys may be used to form the S/D regions 1320.

Electrical signals, such as power and/or input/output (I/O) signals, may be routed to and/or from the devices (e.g., transistors 1340) of the device layer 1304 through one or more interconnect layers disposed on the device layer 1304 (illustrated in FIG. 13 as interconnect layers 1306-2310). For example, electrically conductive features of the device layer 1304 (e.g., the gate 1322 and the S/D contacts 1324) may be electrically coupled with the interconnect structures 1328 of the interconnect layers 1306-1310. The one or more interconnect layers 1306-1310 may form a metallization stack (also referred to as an "ILD stack") 1319 of the IC device 1300.

The interconnect structures 1328 may be arranged within the interconnect layers 1306-2310 to route electrical signals according to a wide variety of designs (in particular, the arrangement is not limited to the particular configuration of interconnect structures 1328 depicted in FIG. 13). Although a particular number of interconnect layers 1306-1310 is depicted in FIG. 13, examples of the present disclosure include IC devices having more or fewer interconnect layers than depicted.

In some examples, the interconnect structures 1328 may include lines 1328*a* and/or vias 1328*b* filled with an electrically conductive material such as a metal. The lines 1328*a* may be arranged to route electrical signals in a direction of a plane that is substantially parallel with a surface of the substrate 1302 upon which the device layer 1304 is formed. For example, the lines 1328*a* may route electrical signals in a direction in and out of the page from the perspective of FIG. 13. The vias 1328*b* may be arranged to route electrical signals in a direction of a plane that is substantially perpendicular to the surface of the substrate 1302 upon which the device layer 1304 is formed. In some examples, the vias 1328*b* may electrically couple lines 1328*a* of different interconnect layers 1306-1310 together.

The interconnect layers 1306-1310 may include a dielectric material 1326 disposed between the interconnect structures 1328, as shown in FIG. 13. In some examples, the dielectric material 1326 disposed between the interconnect structures 1328 in different ones of the interconnect layers 1306-1310 may have different compositions; in other examples, the composition of the dielectric material 1326 between different interconnect layers 1306-1310 may be the same.

A first interconnect layer 1306 (referred to as Metal 1 or "M1") may be formed directly on the device layer 1304. In some examples, the first interconnect layer 1306 may include lines 1328*a* and/or vias 1328*b*, as shown. The lines 1328*a* of the first interconnect layer 1306 may be coupled with contacts (e.g., the S/D contacts 1324) of the device layer 1304.

A second interconnect layer 1308 (referred to as Metal 2 or "M2") may be formed directly on the first interconnect layer 1306. In some examples, the second interconnect layer 1308 may include vias 1328*b* to couple the lines 1328*a* of the second interconnect layer 1308 with the lines 1328*a* of the first interconnect layer 1306. Although the lines 1328*a* and the vias 1328*b* are structurally delineated with a line within each interconnect layer (e.g., within the second interconnect layer 1308) for the sake of clarity, the lines 1328*a* and the vias 1328*b* may be structurally and/or materially contiguous (e.g., simultaneously filled during a dual-damascene process) in some examples.

A third interconnect layer 1310 (referred to as Metal 3 or "M3") (and additional interconnect layers, as desired) may be formed in succession on the second interconnect layer 1308 according to similar techniques and configurations described in connection with the second interconnect layer 1308 or the first interconnect layer 1306. In some examples, the interconnect layers that are "higher up" in the metallization stack 1319 in the IC device 1300 (i.e., further away from the device layer 1304) may be thicker.

The IC device 1300 may include a solder resist material 1334 (e.g., polyimide or similar material) and one or more conductive contacts 1336 formed on the interconnect layers 1306-2310. In FIG. 13, the conductive contacts 1336 are illustrated as taking the form of bond pads. The conductive contacts 1336 may be electrically coupled with the interconnect structures 1328 and configured to route the electrical signals of the transistor(s) 1340 to other external devices. For example, solder bonds may be formed on the one or more conductive contacts 1336 to mechanically and/or electrically couple a chip including the IC device 1300 with another component (e.g., a circuit board). The IC device 1300 may include additional or alternate structures to route the electrical signals from the interconnect layers 1306-2310; for example, the conductive contacts 1336 may include other analogous features (e.g., posts) that route the electrical signals to external components.

Figure 14:
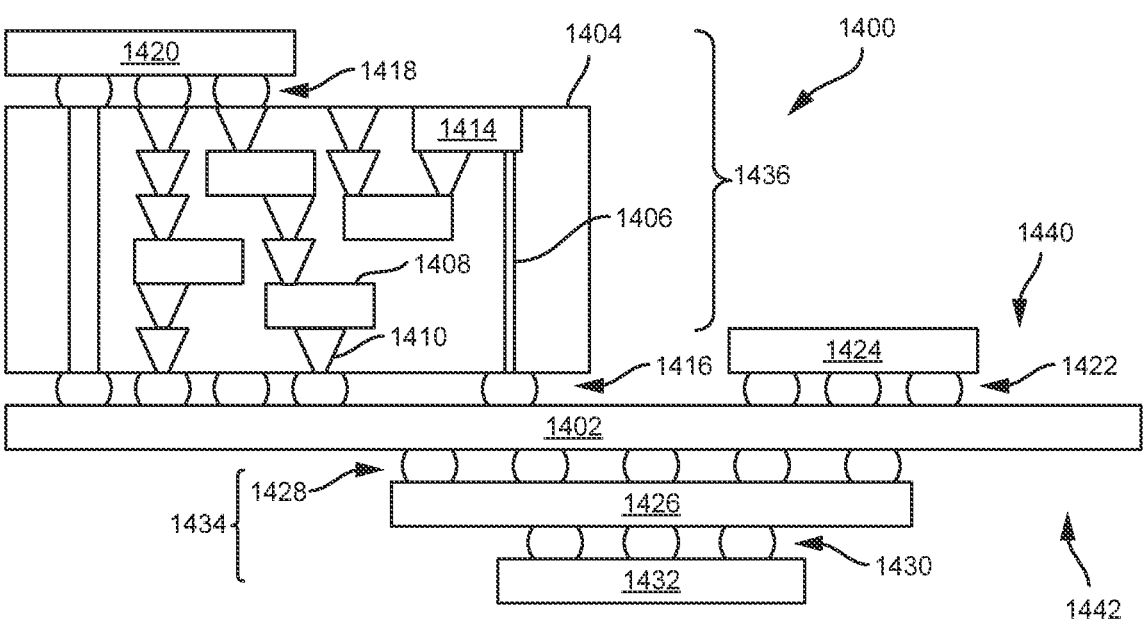
FIG. 14 is a cross-sectional side view of an IC device assembly that may include an IC package constructed in accordance with teachings disclosed herein.

FIG. 14 is a cross-sectional side view of an IC device assembly 1400 that may include the IC package 100 with any one of the example package substrates 400, 425, 450 disclosed herein. The IC device assembly 1400 includes a number of components disposed on a circuit board 1402 (which may be, for example, a motherboard). The IC device assembly 1400 includes components disposed on a first face 1440 of the circuit board 1402 and an opposing second face 1442 of the circuit board 1402; generally, components may be disposed on one or both faces 1440 and 1442. Any of the IC packages discussed below with reference to the IC device assembly 1400 may take the form of any of the examples of the IC package 100 of FIG. 1.

In some examples, the circuit board 1402 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1402. In other examples, the circuit board 1402 may be a non-PCB substrate. In some examples, the circuit board 1402 may be, for example, the circuit board 102 of FIG. 1.

The IC device assembly 1400 illustrated in FIG. 14 includes a package-on-interposer structure 1436 coupled to the first face 1440 of the circuit board 1402 by coupling components 1416. The coupling components 1416 may electrically and mechanically couple the package-on-interposer structure 1436 to the circuit board 1402, and may include solder balls (as shown in FIG. 14), male and female portions of a socket, an adhesive, an underfill material, and/or any other suitable electrical and/or mechanical coupling structure.

The package-on-interposer structure 1436 may include an IC package 1420 coupled to an interposer 1404 by coupling components 1418. The coupling components 1418 may take any suitable form for the application, such as the forms discussed above with reference to the coupling components 1416. Although a single IC package 1420 is shown in FIG. 14, multiple IC packages may be coupled to the interposer 1404; indeed, additional interposers may be coupled to the interposer 1404. The interposer 1404 may provide an intervening substrate used to bridge the circuit board 1402 and the IC package 1420. The IC package 1420 may be or include, for example, a die (the die 1202 of FIG. 12), an IC device (e.g., the IC device 1300 of FIG. 13), or any other suitable component. Generally, the interposer 1404 may spread a connection to a wider pitch or reroute a connection to a different connection. For example, the interposer 1404 may couple the IC package 1420 (e.g., a die) to a set of BGA conductive contacts of the coupling components 1416 for coupling to the circuit board 1402. In the example illustrated in FIG. 14, the IC package 1420 and the circuit board 1402 are attached to opposing sides of the interposer 1404; in other examples, the IC package 1420 and the circuit board 1402 may be attached to a same side of the interposer 1404. In some examples, three or more components may be interconnected by way of the interposer 1404.

The interposer 1404 may be formed of an epoxy resin, a fiberglass-reinforced epoxy resin, an epoxy resin with inorganic fillers, a ceramic material, or a polymer material such as polyimide. In some examples, the interposer 1404 may be formed of alternate rigid or flexible materials that may include the same materials described above for use in a semiconductor substrate, such as silicon, germanium, and other group III-V and group IV materials. The interposer 1404 may include metal interconnects 1408 and vias 1410, including but not limited to through-silicon vias (TSVs) 1406. The interposer 1404 may further include embedded devices 1414, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 1404. The package-on-interposer structure 1436 may take the form of any of the package-on-interposer structures known in the art.

The IC device assembly 1400 may include an IC package 1424 coupled to the first face 1440 of the circuit board 1402 by coupling components 1422. The coupling components 1422 may take the form of any of the examples discussed above with reference to the coupling components 1416, and the IC package 1424 may take the form of any of the examples discussed above with reference to the IC package 1420.

The IC device assembly 1400 illustrated in FIG. 14 includes a package-on-package structure 1434 coupled to the second face 1442 of the circuit board 1402 by coupling components 1428. The package-on-package structure 1434 may include a first IC package 1426 and a second IC package 1432 coupled together by coupling components 1430 such that the first IC package 1426 is disposed between the circuit board 1402 and the second IC package 1432. The coupling components 1428, 1430 may take the form of any of the examples of the coupling components 1416 discussed above, and the IC packages 1426, 1432 may take the form of any of the examples of the IC package 1420 discussed above. The package-on-package structure 1434 may be configured in accordance with any of the package-on-package structures known in the art.

Figure 15:
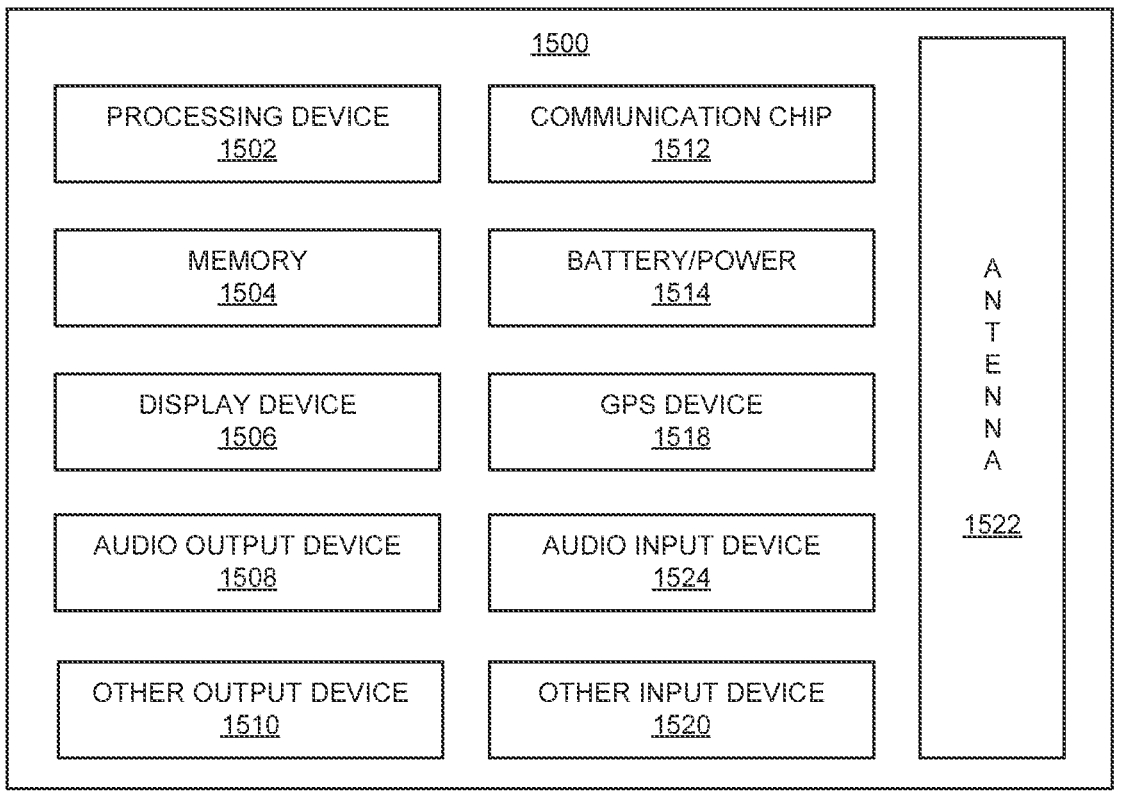
FIG. 15 is a block diagram of an example electrical device that may include an IC package constructed in accordance with teachings disclosed herein.

FIG. 15 is a block diagram of an example electrical device 1500 that may include one or more of the example IC packages 100 of FIG. 1 with any one of the example package substrates 400, 425, 450 disclosed herein. For example, any suitable ones of the components of the electrical device 1500 may include one or more of the IC packages 1400, IC devices 1300, or dies 1202 disclosed herein. A number of components are illustrated in FIG. 15 as included in the electrical device 1500, but any one or more of these components may be omitted or duplicated, as suitable for the application. In some examples, some or all of the components included in the electrical device 1500 may be attached to one or more motherboards. In some examples, some or all of these components are fabricated onto a single system-on-a-chip (SoC) die.

Additionally, in various examples, the electrical device 1500 may not include one or more of the components illustrated in FIG. 15, but the electrical device 1500 may include interface circuitry for coupling to the one or more components. For example, the electrical device 1500 may not include a display device 1506, but may include display device interface circuitry (e.g., a connector and driver circuitry) to which a display device 1506 may be coupled. In another set of examples, the electrical device 1500 may not include an audio input device 1524 or an audio output device 1508, but may include audio input or output device interface circuitry (e.g., connectors and supporting circuitry) to which an audio input device 1524 or audio output device 1508 may be coupled.

The electrical device 1500 may include a processing device 1502 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1502 may include one or more digital signal processors (DSPs), application-specific integrated circuits (ASICs), central processing units (CPUs), graphics processing units (GPUS), cryptoprocessors (specialized processors that execute cryptographic algorithms within hardware), server processors, or any other suitable processing devices. The electrical device 1500 may include a memory 1504, which may itself include one or more memory devices such as volatile memory (e.g., dynamic random access memory (DRAM)), nonvolatile memory (e.g., read-only memory (ROM)), flash memory, solid state memory, and/or a hard drive. In some examples, the memory 1504 may include memory that shares a die with the processing device 1502. This memory may be used as cache memory and may include embedded dynamic random access memory (eDRAM) or spin transfer torque magnetic random access memory (STT-MRAM).

In some examples, the electrical device 1500 may include a communication chip 1512 (e.g., one or more communication chips). For example, the communication chip 1512 may be configured for managing wireless communications for the transfer of data to and from the electrical device 1500. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some examples they might not.

The communication chip 1512 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1512 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1512 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1512 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1512 may operate in accordance with other wireless protocols in other examples. The electrical device 1500 may include an antenna 1522 to facilitate wireless communications and/or to receive other wireless communications (such as AM or FM radio transmissions).

In some examples, the communication chip 1512 may manage wired communications, such as electrical, optical, or any other suitable communication protocols (e.g., the Ethernet). As noted above, the communication chip 1512 may include multiple communication chips. For instance, a first communication chip 1512 may be dedicated to shorter-range wireless communications such as Wi-Fi or Bluetooth, and a second communication chip 1512 may be dedicated to longer-range wireless communications such as global positioning system (GPS), EDGE, GPRS, CDMA, WiMAX, LTE, EV-DO, or others. In some examples, a first communication chip 1512 may be dedicated to wireless communications, and a second communication chip 1512 may be dedicated to wired communications.

The electrical device 1500 may include battery/power circuitry 1514. The battery/power circuitry 1514 may include one or more energy storage devices (e.g., batteries or capacitors) and/or circuitry for coupling components of the electrical device 1500 to an energy source separate from the electrical device 1500 (e.g., AC line power).

The electrical device 1500 may include a display device 1506 (or corresponding interface circuitry, as discussed above). The display device 1506 may include any visual indicators, such as a heads-up display, a computer monitor, a projector, a touchscreen display, a liquid crystal display (LCD), a light-emitting diode display, or a flat panel display.

The electrical device 1500 may include an audio output device 1508 (or corresponding interface circuitry, as discussed above). The audio output device 1508 may include any device that generates an audible indicator, such as speakers, headsets, or earbuds.

The electrical device 1500 may include an audio input device 1524 (or corresponding interface circuitry, as discussed above). The audio input device 1524 may include any device that generates a signal representative of a sound, such as microphones, microphone arrays, or digital instruments (e.g., instruments having a musical instrument digital interface (MIDI) output).

The electrical device 1500 may include a GPS device 1518 (or corresponding interface circuitry, as discussed above). The GPS device 1518 may be in communication with a satellite-based system and may receive a location of the electrical device 1500, as known in the art.

The electrical device 1500 may include any other output device 1510 (or corresponding interface circuitry, as discussed above). Examples of the other output device 1510 may include an audio codec, a video codec, a printer, a wired or wireless transmitter for providing information to other devices, or an additional storage device.

The electrical device 1500 may include any other input device 1520 (or corresponding interface circuitry, as discussed above). Examples of the other input device 1520 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1500 may have any desired form factor, such as a hand-held or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server or other networked computing component, a printer, a scanner, a monitor, a set-top box, an entertainment control unit, a vehicle control unit, a digital camera, a digital video recorder, or a wearable electrical device. In some examples, the electrical device 1500 may be any other electronic device that processes data.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, or (7) A with B and with C. As used herein in the context of describing structures, components, items, objects and/or things, the phrase "at least one of A and B" is intended to refer to implementations including any of (1) at least one A, (2) at least one B, or (3) at least one A and at least one B. Similarly, as used herein in the context of describing structures, components, items, objects and/or things, the phrase "at least one of A or B" is intended to refer to implementations including any of (1) at least one A, (2) at least one B, or (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, or (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, or (3) at least one A and at least one B.

As used herein, singular references (e.g., "a", "an", "first", "second", etc.) do not exclude a plurality. The term "a" or "an" object, as used herein, refers to one or more of that object. The terms "a" (or "an"), "one or more", and "at least one" are used interchangeably herein. Furthermore, although individually listed, a plurality of means, elements or method actions may be implemented by, e.g., the same entity or object. Additionally, although individual features may be included in different examples or claims, these may possibly be combined, and the inclusion in different examples or claims does not imply that a combination of features is not feasible and/or advantageous.

Example methods, apparatus, systems, and articles of manufacture to enable electrical routing on glass cores in integrated circuit packages are disclosed herein. Further examples and combinations thereof include the following:

Example 1 includes an integrated circuit (IC) package substrate comprising a glass core, a photo-imageable dielectric (PID) material on the glass core, and metal interconnects in openings in the PID material.

Example 2 includes the IC package substrate of example 1, wherein the PID material includes at least one of polyimide (PI), polybenz-oxazoles (PBO), Benzocyclobutene (BCB), epoxy or an acrylic.

Example 3 includes the IC package substrate of example 1, wherein the metal interconnects include a through-glass-via (TGV) that extends through the glass core.

Example 4 includes the IC package substrate of example 3, wherein the metal interconnects include a contact pad at an end of the TGV, a width of the contact pad being larger than a width of the TGV.

Example 5 includes the IC package substrate of example 1, wherein the metal interconnects include electrical routing extending along a surface of the glass core in a plane.

Example 6 includes the IC package substrate of example 5, wherein the electrical routing is in direct contact with the glass core.

Example 7 includes the IC package substrate of example 5, wherein the electrical routing is separated from the glass core by no material other than at least one of an adhesion layer or a metal seed layer.

Example 8 includes the IC package substrate of example 7, wherein the adhesion layer includes at least one of silicon or nitride.

Example 9 includes the IC package substrate of example 7, wherein the metal seed layer includes titanium.

Example 10 includes the IC package substrate of example 1, further including a build-up layer dielectric material on the PID material, the build-up layer dielectric material different than the PID material.

Example 11 includes an integrated circuit (IC) package comprising a semiconductor die, a package substrate to support the semiconductor die, the package substrate including a glass core, and metal traces extending along a surface of the glass core, no build-up layer dielectric material between the glass core and the metal traces.

Example 12 includes the IC package of example 11, further including a photo-imageable dielectric (PID) material extending along the surface of the glass core, the metal traces within openings in the PID material.

Example 13 includes the IC package of example 12, wherein the PID material is at least one of polyimide (PI), polybenz-oxazoles (PBO), or Benzocyclobutene (BCB).

Example 14 includes the IC package of example 12, further including a dielectric build-up layer deposited on PID material, the dielectric material different than the PID material.

Example 15 includes the IC package of example 12, further including at least one of an adhesion layer or a metal seed layer deposited on the glass core, the at least one of the adhesions layer or the metal seed layer being the only material between the metal traces and the surface of the glass core.

Example 16 includes a method of manufacturing an integrated circuit (IC) package, the method comprising providing a glass core, depositing a photo-imageable dielectric (PID) material on the glass core, patterning the PID material, using photolithography, to create openings in the PID material, and depositing copper on the glass in the openings in the PID material.

Example 17 includes the method of example 16, further including fabricating a through-glass-via (TGV) in the glass core, and depositing the copper in the TGV, the depositing of the copper in the openings in the PID material and the depositing of the copper in the TGV accomplished in a single process.

Example 18 includes the method of example 17, wherein first ones of the openings in the PID material define a location for a contact pad at an end of the TGV.

Example 19 includes the method of example 18, wherein second ones of the openings in the PID material define locations for electrical traces.

Example 20 includes the method of example 17, where the depositing of the copper in the openings in the PID material includes depositing excess copper on the PID material, the method further including removing the excess copper to isolate the copper in different ones of the openings in the PID material.

Although certain example systems, methods, apparatus, and articles of manufacture have been disclosed herein, the scope of coverage of this patent is not limited thereto. On the contrary, this patent covers all systems, methods, apparatus, and articles of manufacture fairly falling within the scope of the claims of this patent.

The following claims are hereby incorporated into this Detailed Description by this reference, with each claim standing on its own as a separate embodiment of the present disclosure.

What is claimed is:

1. An integrated circuit (IC) package substrate comprising:
    a glass core defined by a sheet of glass;
    a photo-imageable dielectric (PID) material on the glass core; and
    metal interconnects in openings in the PID material, the metal interconnects including electrical routing extending along a surface of the glass core, the electrical routing in direct contact with the glass.

2. The IC package substrate of claim 1, wherein the PID material includes at least one of polyimide (PI), polybenzoxazoles (PBO), Benzocyclobutene (BCB), epoxy or an acrylic.

3. The IC package substrate of claim 1, wherein the metal interconnects include a through-glass-via (TGV) that extends through the glass core.

4. The IC package substrate of claim 3, wherein the metal interconnects include a contact pad at an end of the TGV, a width of the contact pad being larger than a width of the TGV.

5. The IC package substrate of claim 1, including a build-up layer dielectric material on the PID material, the build-up layer dielectric material different than the PID material.

6. The IC package of claim 1, wherein the PID material and the electrical routing have a same thickness.

7. The IC package of claim 1, wherein the PID material has a first surface facing away from glass core, and the metal interconnects have second surfaces facing away from glass core, the first surface coplanar with the second surfaces.

8. An integrated circuit (IC) package comprising:

a semiconductor die; and a package substrate to support the semiconductor die, the package substrate including:

a glass core;

a dielectric build-up layer having a first surface and a second surface, the first surface facing towards the glass core, the second surface facing away from the glass core; and metal traces extending along a surface of the glass core, the metal traces closer to the glass core than the dielectric build-up layer is to the glass core, the first surface of the dielectric build-up layer in contact with the metal traces, the dielectric build-up layer not between the glass core and the metal traces.

9. The IC package of claim 8, including a photo-imageable dielectric (PID) material extending along the surface of the glass core, the metal traces within openings in the PID material.

10. The IC package of claim 9, wherein the PID material is at least one of polyimide (PI), polybenz-oxazoles (PBO), or Benzocyclobutene (BCB).

11. The IC package of claim 9, wherein the dielectric build-up layer is different than the PID material.

12. The IC package of claim 9, including at least one of an adhesion layer or a metal seed layer on the glass core, the at least one of the adhesion layer or the metal seed layer being the only material between the metal traces and the surface of the glass core.

13. The IC package of claim 8, wherein the metal traces are first metal traces, the IC package including second metal traces, the second metal traces in contact with the second surface of the dielectric build-up layer, the dielectric build-up layer closer to the glass core than the second metal traces are to the glass core.

14. The IC package of claim 13, wherein the first metal traces are in a first conductive layer, and the second metal traces are in a second conductive layer, and there are no other conductive layers defining other metal traces between the first and second conductive layers.

15. The IC package of claim 9, wherein the PID material includes a first surface proximate to the glass core and a second surface distal from the glass core, and the metal traces include third surfaces proximate to the glass core and fourth surfaces distal from the glass core, the first surface of the PID material aligned with the third surfaces of the metal traces, the second surface of the PID material aligned with the fourth surfaces of the metal traces.

16. An integrated circuit (IC) package substrate comprising:

a glass core defined by a piece of glass;

a photo-imageable dielectric (PID) material on the glass core; and metal interconnects in openings in the PID material, the metal interconnects including electrical routing extending along a surface of the glass core, the electrical routing not separated from the glass by any material other than at least one of an adhesion layer or a metal seed layer.

17. The IC package substrate of claim 16, wherein the adhesion layer has a first thickness and the PID material has a second thickness, the second thickness multiple times greater than the first thickness.

18. The IC package substrate of claim 17, wherein the first thickness is less than 500 nanometers.

19. The IC package substrate of claim 16, including the adhesion layer, the adhesion layer including at least one of silicon or nitride.

20. The IC package substrate of claim 16, including the metal seed layer, the metal seed layer including titanium.

\* \* \* \* \*